United States Patent
Barry et al.

(10) Patent No.: US 6,882,227 B2
(45) Date of Patent: Apr. 19, 2005

(54) BIAS CIRCUIT LINEARIZATION AND DYNAMIC POWER CONTROL

(75) Inventors: Daryl W. Barry, Dunwoody, GA (US); Carl S. Chun, Atlanta, GA (US); Sangwoo Han, Dunwoody, GA (US); Thomas B. Smith, Decatur, GA (US); Michael W. Trippe, Norcross, GA (US)

(73) Assignee: Anadigics, Norcross, GA (US)

( * ) Notice: Subject to any disclaimer, the term of this patent is extended or adjusted under 35 U.S.C. 154(b) by 27 days.

(21) Appl. No.: 10/662,849

(22) Filed: Sep. 15, 2003

(65) Prior Publication Data
US 2004/0130374 A1 Jul. 8, 2004

Related U.S. Application Data
(60) Provisional application No. 60/410,842, filed on Sep. 13, 2002.

(51) Int. Cl.[7] .................................................. H03F 3/04
(52) U.S. Cl. ........................................ 330/296; 330/285
(58) Field of Search ................................ 330/296, 285, 330/302, 297, 288; 323/315, 316

(56) References Cited

U.S. PATENT DOCUMENTS

| 6,486,724 | B1 | | 11/2002 | Sakamoto et al. |
|---|---|---|---|---|
| 6,492,869 | B1 | | 12/2002 | Kuriyama |
| 6,515,546 | B1 | | 2/2003 | Liwinski |
| 6,549,076 | B1 | * | 4/2003 | Kuriyama .................... 330/296 |
| 6,605,982 | B1 | | 8/2003 | Callahan |
| 6,744,321 | B1 | * | 6/2004 | Noh et al. ................... 330/296 |
| 6,750,718 | B1 | * | 6/2004 | Moriwaki et al. .......... 330/285 |
| 6,803,822 | B1 | * | 10/2004 | Kim et al. ................... 330/296 |
| 2002/0140506 | A1 | | 10/2002 | Kobayashi |
| 2002/0181612 | A1 | | 12/2002 | Warble et al. |
| 2002/0186079 | A1 | | 12/2002 | Kobayashi |
| 2003/0020540 | A1 | | 1/2003 | Johnson |
| 2003/0122079 | A1 | | 7/2003 | Pobanz et al. |

* cited by examiner

Primary Examiner—Henry Choe
(74) Attorney, Agent, or Firm—Tucker Ellis & West LLP

(57) ABSTRACT

A transistor bias circuit is provided that is capable of biasing an amplifier transistor having a control terminal, a current-sink terminal, and a current-source terminal in order to control inter-modulation and linearize the output corresponding to radio frequency and microwave frequency ranges. Additionally, an embodiment of the present circuit is capable of dynamic power control. The transistor bias circuit according to the present invention utilizes a leakage current to alter the electrical characteristics of the amplifier transistor. The bias circuit comprises a bias transistor having a control terminal, a current-sink terminal, and a current-source terminal. Additionally, at least one DC input port, at least one resonator element, a diode element, and a resistive element is provided.

9 Claims, 3 Drawing Sheets

BIAS CIRCUIT LINEARIZATION AND DYNAMIC POWER CONTROL

RELATED APPLICATIONS

The present application is related to and claims priority benefit of the filing date of a U.S. provisional patent application titled: HBT BIAS CIRCUIT LINEARIZATION AND DYNAMIC POWER CONTROL; Ser. No. 60/410,842, filed Sep. 13, 2002, which is hereby incorporated by reference into the present application.

BACKGROUND

The present invention is generally directed to the design and implementation of complex circuits to reduce distortion and linearize the output corresponding to radio frequency (RF) and microwave frequency ranges. An embodiment of the present integrated circuitry (IC) is configured to use a combination of Heterojunction Bipolar transistors (HBT) and resonant circuits to effectively provide linearization and dynamic power control for RF and microwave signals.

Today, one problem with operating a power amplifier at low distortion levels is that the efficiency of the amplifier circuit is greatly reduced because it is not amplifying at its highest capability. Therefore, a circuit according to the present system can preferably utilize a bias circuit to adjust the bias characteristics and subsequent power amplification corresponding to changing circuit conditions.

Specifically, the circuit may preferably utilize a leakage current of the RF input to determine the state of amplification and accordingly adjust the bias. By adjusting the bias conditions and power amplification characteristics to the existing conditions, power amplification efficiency is greatly improved.

Demands on the linearity and efficiency of power amplifiers are common in radio frequency and microwave communication systems. Conventionally, power amplifiers normally operate at maximum efficiency at or near saturation. However, in order to accommodate the linearity of today's devices with communication signals having varying amplitudes (e.g. cellular telephones), systems utilizing conventional power amplifiers normally operate at less than peak efficiency for a substantial portion of the time.

Of course, in today's market, wireless communications devices, such as cellular telephones, must consistently provide clear and undistorted transmissions. As well, the batteries in the devices must be small in physical size while maintaining a long operating life.

In order to meet these consumer requirements, wireless telephone designers and engineers have moved away from using traditional silicon-based bipolar transistors in power amplifiers and toward using more exotic transistors, such as heterojunction bipolar transistors ("HBTs") made of aluminum-gallium-arsenide/gallium-arsenide ("AlGaAs/GaAs") and indium-gallium-phosphide/gallium-arsenide ("InGaP/GaAs"). Such HBTs provide outstanding power efficiency and high linearity, thus enabling cellular phones to achieve longer battery life and better signal characteristics for voice and data.

Additionally, the trend in data networks is to provide higher data rates with complex modulation schemes. Complex modulation schemes require the design and implementation of linear systems in order for data transmission to be successful. In most cases, linear system design places significant constraints on individual circuits within the system. Quite often the modulated signals applied to the system have very high peak-to-average-power-ratio (PAPR) which requires the individual circuits in the system to be designed so that they can withstand a large range of power levels. Essentially, the individual circuits must be designed with a large dynamic range, which makes the circuits inefficient and expensive.

Ultimately, circuit linearization techniques provide solutions to problems associated with signals requiring large dynamic ranges. Techniques that implement feedback, predistortion, feedforward, and other signal processing concepts are not feasible for use in RFIC designs. The technique used in the present embodiments allows for linearization and dynamic power control to be implemented in RFICs by manipulating aspects of the bias circuitry.

The present circuitry provides a linear amplifier configured with a bias circuit which is capable of realizing a high-efficiency operation during high output, while maintaining a linear operation.

Additional embodiments, advantages and novel features of the invention will be set forth in part in the description which follows, and in part will become apparent to those skilled in the art upon examination of the following or may be learned by practice of the invention.

SUMMARY OF THE INVENTION

In accordance with one embodiment, a transistor bias circuit is provided that is capable of biasing an amplifier transistor having a control terminal, a current-sink terminal, and a current-source terminal.

The bias circuit comprises a bias transistor having a control terminal, a current-sink terminal, and a current-source terminal. A first DC input port is connected to the current sink terminal of the bias transistor is provided. A first resonator element is connected between the current-sink terminal of the bias transistor and ground. A second DC input port is connected to the control terminal of the bias transistor. A diode element is connected between the control terminal of the bias transistor and ground. A second resonator element is connected between the control terminal of the bias transistor and ground. Finally, a resistive element is provided and connected between the current source terminal of the bias transistor and the control terminal of the amplifier transistor.

The bias transistor according to one embodiment may be one of a BJT, an HBT and a FET. Likewise, the amplifier transistor according to one embodiment may be one of a BJT, an HBT and a FET.

In another embodiment, the first, second and third resonators may individually be RLC circuits. Additionally, the diode element may include a plurality of diodes. Also, the resistive element may be a resistor, an RLC circuit or a combination of both.

BRIEF DESCRIPTION OF THE DRAWINGS

It will be appreciated that the illustrated elements in the figures represent one example of the elements. One of ordinary skill in the art will appreciate that one element may be designed as multiple elements or that multiple elements may be designed as one element. An element shown as an internal component of another element may be implemented as an external component and vice versa.

DETAILED DESCRIPTION OF ILLUSTRATED EMBODIMENTS

Among those benefits and improvements that have been disclosed, other objects and advantages of this invention will become apparent from the following description taken in conjunction with the accompanying drawings. The drawings constitute a part of this specification and include exemplary embodiments of the present invention and illustrate various objects and features thereof.

Throughout this description, the embodiments and examples shown should be considered as exemplars, rather than limitations, of the present circuit. Of course, these embodiments and examples are not intended to be limiting and other embodiments may be implemented.

An HBT, like a bipolar junction transistor ("BJT"), requires a direct-current current ("DC") bias signal comprising both a voltage and a current to be applied to its input terminal to establish its operating point. The operating point of a transistor may be defined as the point on the transistor's characteristic curves at which the transistor will operate in the absence of an input signal.

Because changes in the DC bias signal affect the operating point of an HBT thus affecting the linearity of the amplifier, the DC bias signal must be very stable. Additionally, the DC bias signal must be unaffected by variations in temperature or in the power supply voltage. Such a DC bias signal is normally generated by a "bias circuit."

Briefly describing one embodiment of the present system, it provides for a circuit including a main amplifier circuit and a bias circuit. Generally, the circuit is configured to utilize an RF drive level to alter the electrical characteristics of a bias circuit surrounding a main RF amplifier in order to provide Intermodulation (IM) cancellation and dynamic power control.

Figure 1:
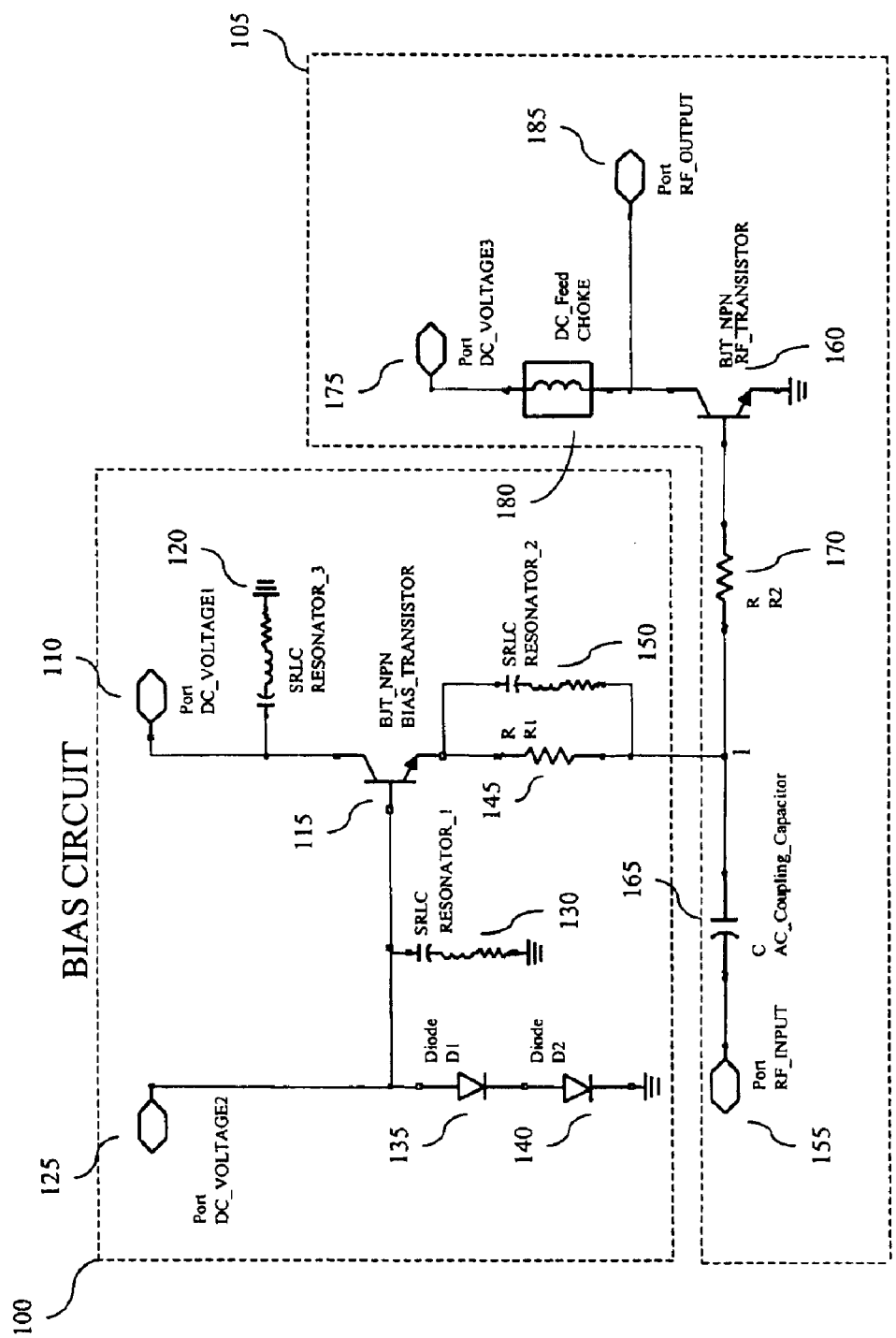
FIG. 1 is a circuit diagram of an embodiment of an RF transistor amplifier with an impedance controlled bias circuit.

FIG. 1 illustrates an embodiment of the present system under normal operation. Generally, the embodiment includes a bias circuit 100 and a main amplifier circuit 105. Each of these components will be discussed in greater detail below.

As shown in the embodiment of FIG. 1, the bias circuit 100 comprises a first DC voltage input 110 connected to the collector terminal of a bias transistor 115. A first RLC circuit or resonator 120 is connected to the collector terminal of the bias transistor 115 on one end and to ground on the opposite end as shown.

A second DC voltage input 125 may be connected to the base terminal of the bias transistor 115. As well, a second RLC circuit or resonator 130 is connected to the base terminal of the bias transistor 115 on one end and to ground on the opposite end as shown. Additionally, two diodes 135, 140 in series are connected to the base terminal of the bias transistor 115 on one end and to ground on the other end.

A resistor 145 and third RLC circuit or resonator 150 are connected in parallel to the emitter terminal of the bias transistor 115. The opposite end of the parallel configuration is connected to the primary amplifier circuit 105 at terminal 1.

Continued reference to FIG. 1 illustrates the primary amplifier circuit 105 comprising an RF input 155 connected to the base terminal of an RF transistor 160 separated by a serially connected AC coupling capacitor 165 and resistor 170. The emitter terminal of RF transistor 160 is connected to ground. A third DC input voltage 175 may be connected to one end of choke 180. The opposite end of choke 180 is connected to the collector terminal of the RF transistor 160. Finally, an RF output 185 is connected to the collector of transistor 160.

The operation of the circuit under normal conditions will be better understood with reference to FIG. 1. As shown, FIG. 1 illustrates one embodiment of the bias circuit 100 in accordance with normal operation. In this embodiment, a bias transistor 115 and various resonator circuits 120, 130, 150 are configured to provide controlled impedances to the system thus optimizing the biasing and operation of the RF transistor 160.

Under normal conditions, the RF input 155 signal flows through the AC coupling capacitor 165 and resistor, R2 170 and into the base of the RF transistor 160. Also under normal operation, DC voltage 175 is applied to the collector of the RF transistor 160.

Upon regulating the DC input voltages 110, 125, the bias circuit 100 provides a bias current to the RF transistor 160 through R1 145 and R2 170 in order to bias the RF transistor 160. In this case, the resistor, R2 170, functions as both an impedance matching element as well as a current setting ballast resistor. The RF transistor 160 subsequently amplifies the RF input signal 155 increasing the output 185.

Figure 2:
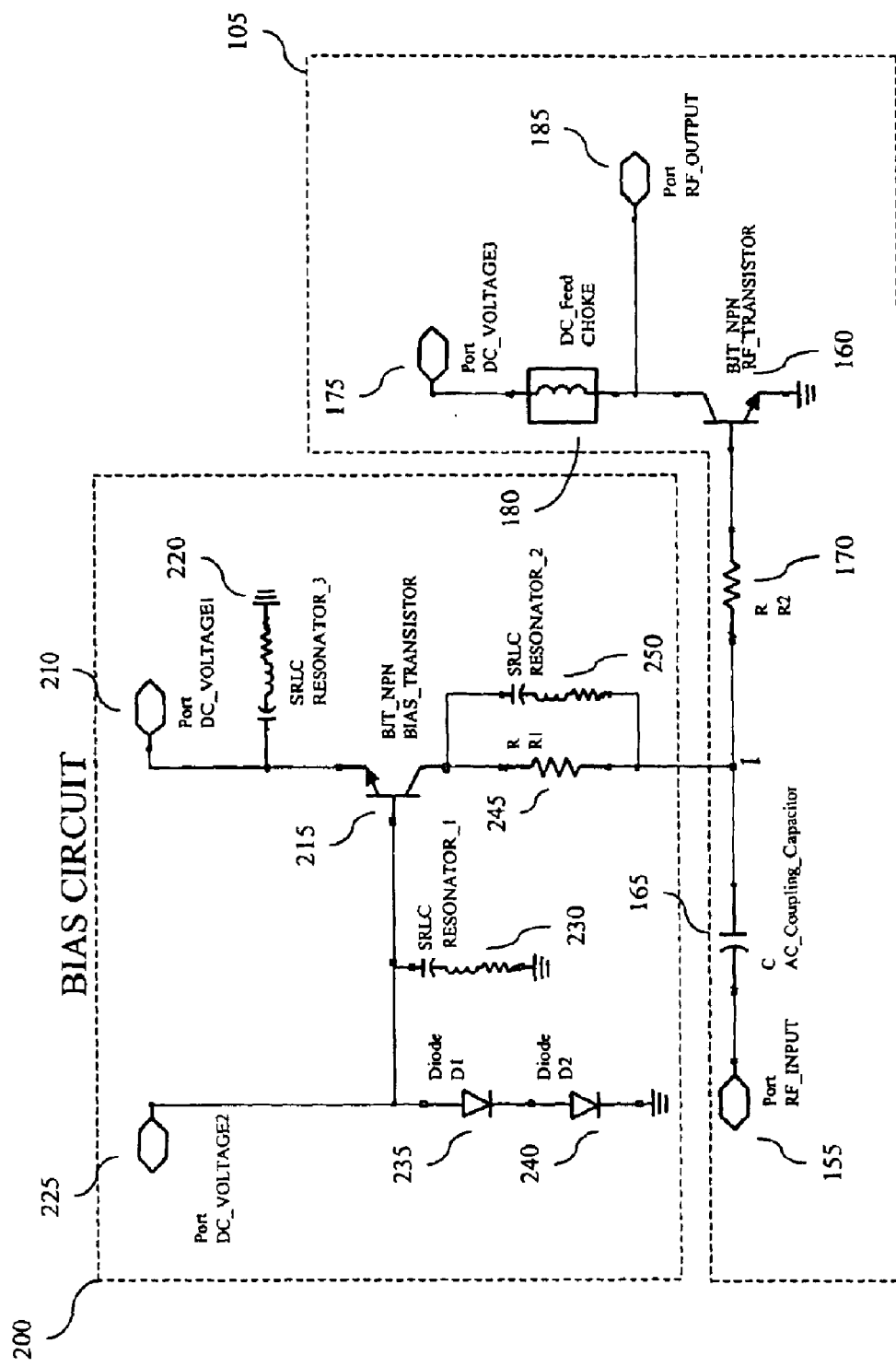
FIG. 2 is a circuit diagram of an embodiment of an RF transistor amplifier with an alternate impedance controlled bias circuit.

Illustrated in FIG. 2 is an alternate embodiment of the present circuitry. The circuitry in FIG. 2 includes a bias circuit 200 having various resistors, inductors and capacitors to provide specific impedances at desired points to allow for optimized RF signal leakage into the bias circuit 200. As a result of the optimized RF signal leakage, the bias circuit can be configured to linearize the RF output signal as well as provide bias point shifts. In doing so, the bias circuit is configured to allow for a wide dynamic range of output powers which are extremely linear while maintaining high efficiency.

Continued reference to FIG. 2 illustrates that the alternative embodiment generally provides a circuit design configured to utilize the RF input 155 and corresponding leakage to affect the performance of the bias circuitry 200. In other words, the basic operation of this alternate embodiment utilizes the an RF input signal leakage into the bias circuit 100 to provide a means to both linearize the RF output 185 and cause the bias current into the RF transistor 160 to increase.

In operation, as under normal conditions, the RF input signal 155 flows through the AC Coupling Capacitor 165 and R2 170 and into the base of the RF transistor 160.

Additionally, an RF input signal leakage flows into the bias circuit 200 at terminal 1. An artisan will appreciate that the amount of RF input signal leakage entering the bias circuit 200 at terminal 1 may be controlled by a combination of the impedance of both the resistor R1 245 as well as the Resonator 2 250.

Next, the RF input signal leakage flows through both a bias transistor 215 base to emitter diode junction as well as a bias transistor base to collector diode junction. As shown in FIG. 2, the alternate connection of bias transistor 215 permits the RF input signal leakage flow into the collector terminal of bias transistor 215 from the parallel impedance configuration or R1 245 and Resonator 2 250.

The combination of Resonator 1 230 and Resonator 3 220 provide controlled impedances that prompt the RF input leakage signal to both cancel Intermodulation (IM) distortion products and shift the bias point by utilizing the bias transistor's diode junctions.

The IM distortion is canceled by utilizing the bias transistor's diode characteristics in conjunction with the resonant circuits 220, 230 to provide a specific phase and amplitude of the IM products to the base of the RF transistor 160. The summation of the original RF input signal 155 and the RF input signal altered by the bias circuit 200 produces a lower IM distortion input signal.

Next, this lower IM distortion combined input signal is amplified by the RF transistor 160. It will be appreciated that utilizing the diode characteristics of the bias transistor 220 in conjunction with the resonant circuits 220, 230 to shift the bias transistor's DC operating point may also provide dynamic power control of the RF output 185.

Figure 3:
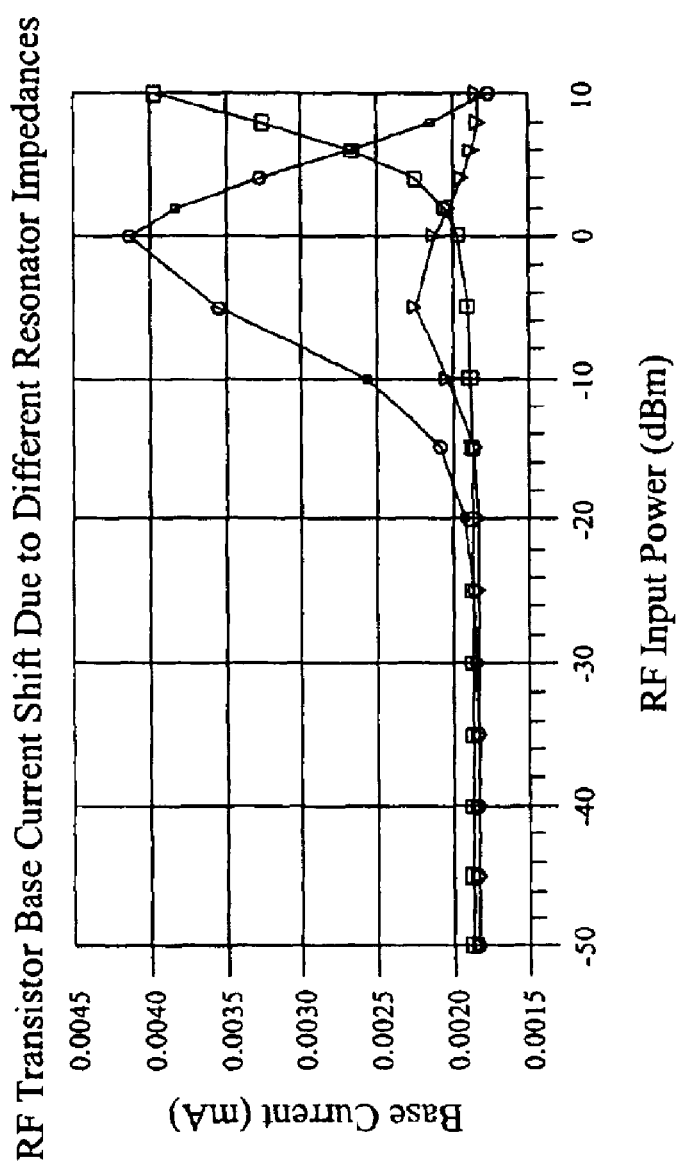
FIG. 3 illustrates one embodiment of a plot of RF transistor base current supplied by the bias circuit utilizing different resonator impedances.

Reference to FIG. 3 illustrates that the bias transistor's DC operating point shifts as the RF input signal level increases and thus forces more DC current into the RF transistor 160. Essentially, both the bias circuit shift and the IM cancellation allow for better efficiency at both low and high RF output power levels. As described by the embodiments, the present invention provides a means to incorporate linearization and dynamic power control on an RFIC with smaller device sizes.

It will be appreciated that although the embodiment described herein discloses a bias circuit utilizing an HBT. Other types of transistors known in the art may be used without departing from the scope of the embodiments. For instance, alternative embodiments may use npn-type or pnp-type BJTs, other varieties of HBTs, or field-effect transistors ("FETs").

In summary, it will be appreciated that the present embodiment utilizes a multitude of linearization techniques into the circuitry to manipulate the HBT bias circuit. Furthermore, it will be appreciated that these manipulation techniques may permit the present technology to be implemented in RFIC processes.

Of course, it will be understood that the present system may be used in applications where the characteristics of the power amplifier circuit can be modified to compensate for changing conditions. One example of an implementation where compensation for changing conditions obtains benefits is a power amplifier circuit in a cellular telephone.

One skilled in the art will recognize that the power amplification requirements of a cellular telephone change in accordance with the conditions under which the telephone is operating. For example, when the telephone operates in a region that is saturated with cellular traffic, high-accuracy cellular signals are required to limit interference from other cellular signals. In a less saturated region, the cellular signals can be relatively less accurate because there are fewer competing cellular signals to avoid.

In alternative embodiments, the power amplifier and bias circuits according to the invention may be implemented in circuits for use in a multitude of wireless communications networks. These networks, for example, may include wireless modems, wireless LAN, wireless Personal Area Network (PAN), digital communication systems, and the like.

It will further be understood that the wireless communications network may also be adapted to work with a low-powered radio system which allows products containing similar technology to be interconnected via wireless communication. This low-powered radio technology may preferably provide connection to a wide range of computing and telecommunication devices via wireless connections as is known in the art.

While the present invention has been illustrated by the description of embodiments thereof, and while the embodiments have been described in considerable detail, it is not the intention of the applicants to restrict or in any way limit the scope of the appended claims to such detail. It is obvious that equivalent alterations and modifications will become apparent to others skilled in the art upon the reading and understanding of this specification. The present invention includes all such equivalent alterations and modifications.

Therefore, the invention, in its broader aspects, is not limited to the specific details, the representative apparatus, and illustrative examples shown and described. Accordingly, departures may be made from such details without departing from the spirit or scope of the applicant's general inventive concept.

We claim:

1. A circuit for biasing an amplifier transistor comprising a control terminal, a current-sink terminal, and a current-source terminal, the circuit comprising:

a bias transistor including a control terminal, current-sink terminal, and a current-source terminal;

a first DC input port connected to the current sink terminal of the bias transistor;

a first resonator element operatively coupled to the current-sink terminal of the bias transistor and ground;

a second DC input port connected to the control terminal of the bias transistor;

a diode element operatively coupled to the control terminal of the bias transistor and ground;

a second resonator element operatively coupled to the control terminal of the bias transistor and ground; and a resistive element operatively coupled to the current source terminal of the bias transistor and the control terminal of the amplifier transistor.

2. The circuit as set forth in claim 1 wherein the bias transistor is one of a BJT, an HBT and a FET.

3. The circuit as set forth in claim 1 wherein the amplifier transistor is one of a BJT, an HBT and a FET.

4. The circuit as set forth in claim 1 wherein the first resonator is an RLC circuit.

5. The circuit as set forth in claim 1 wherein the diode element comprises a plurality of diodes.

6. The circuit as set forth in claim 1 wherein the second resonator is an RLC circuit.

7. The circuit as set forth in claim 1 wherein the resistive element is a resistor.

8. The circuit as set forth in claim 1 wherein the resistive element is an RLC circuit.

9. The circuit as set forth in claim 8 wherein the resistive element further comprises a resistor.

* * * * *